(12) United States Patent
Almonte et al.

(10) Patent No.: US 8,461,849 B1
(45) Date of Patent: Jun. 11, 2013

(54) MULTIVARIATE PREDICTIVE INSULATION RESISTANCE MEASUREMENT

(75) Inventors: Kenneth V. Almonte, Portland, OR (US); Charles Bickford, Portland, OR (US); Spencer Barrett, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 119 days.

(21) Appl. No.: 12/871,881

(22) Filed: Aug. 30, 2010

Related U.S. Application Data

(63) Continuation-in-part of application No. 11/565,459, filed on Nov. 30, 2006, now abandoned.

(51) Int. Cl.
*G01R 31/12* (2006.01)

(52) U.S. Cl.
USPC .......................................... 324/548

(58) Field of Classification Search
USPC .......................................... 324/548
See application file for complete search history.

(56) References Cited

U.S. PATENT DOCUMENTS

| | | | |
|---|---|---|---|
| 4,267,503 A | 5/1981 | Westra | |
| 4,743,837 A | 5/1988 | Herzog | |
| 4,931,721 A | 6/1990 | Berrigan et al. | |
| 5,166,538 A | 11/1992 | Norton | |
| 5,510,719 A | 4/1996 | Yamamoto | |
| 5,677,634 A | 10/1997 | Cooke et al. | |
| 5,798,648 A * | 8/1998 | Ueyama et al. | 324/548 |
| 6,025,567 A * | 2/2000 | Brooks | 209/574 |
| 6,043,665 A | 3/2000 | Nishioka et al. | |
| 6,198,290 B1 | 3/2001 | Krinker | |
| 6,348,798 B1 | 2/2002 | Daw | |
| 6,448,525 B1 * | 9/2002 | Nishioka et al. | 209/574 |
| 6,459,707 B1 | 10/2002 | Becker | |
| 6,469,516 B2 | 10/2002 | Nishioka et al. | |
| 6,509,745 B1 | 1/2003 | Marszalek | |
| 6,518,777 B2 | 2/2003 | Kamitani et al. | |
| 6,677,637 B2 | 1/2004 | Bernstein et al. | |
| 6,882,015 B2 | 4/2005 | Bernstein et al. | |
| 6,907,363 B1 | 6/2005 | Wyant et al. | |
| 7,148,697 B2 * | 12/2006 | Doljack | 324/548 |
| 7,173,438 B2 | 2/2007 | Pooranakaran et al. | |

(Continued)

FOREIGN PATENT DOCUMENTS

| | | |
|---|---|---|
| JP | 10-227821 A | 8/1998 |
| JP | 2002-505010 A | 2/2002 |
| JP | 2003-133189 A | 5/2003 |

OTHER PUBLICATIONS

Green, D.C., Digital Electronics, Addison Wesley Longman, 1999, p. 328-342.

*Primary Examiner* — Jeff Natalini
(74) *Attorney, Agent, or Firm* — Young Basile

(57) ABSTRACT

A plurality of capacitors is subjected to a test cycle of charging, soaking and discharging. While in the soaking cycle, a plurality of measurements of current is obtained. The data is used to train a predictive function. Then, a test capacitor is charged and soaked for a shorter period than the plurality of capacitors. The current through the test capacitor is measured more than once during its soak period, and the measured current values are applied to the predictive function to predict whether the current through the test capacitor at the end of the soak time period would be higher than a predetermined value, thus indicating failure of a leakage test by test capacitor.

13 Claims, 4 Drawing Sheets

U.S. PATENT DOCUMENTS

| | | |
|---|---|---|
| 7,540,885 B2 | 6/2009 | Kamitani |
| 7,663,382 B2 * | 2/2010 | Corulli et al. ............... 324/713 |
| 2005/0007096 A1 * | 1/2005 | Dimino et al. ............... 324/142 |
| 2008/0133168 A1 * | 6/2008 | Barrett ....................... 702/121 |

* cited by examiner

MULTIVARIATE PREDICTIVE INSULATION RESISTANCE MEASUREMENT

CROSS-REFERENCE TO RELATED APPLICATION

This application is a continuation-in-part of co-pending U.S. patent application Ser. No. 11/565,459, filed Nov. 30, 2006, the entire contents of which are incorporated herein in their entirety by reference.

FIELD OF THE INVENTION

The present invention relates to data acquisition for capacitor testing, and in particular to an improved predictive measurement for the insulation resistance of a capacitor.

BACKGROUND

A manufacturer of capacitors, such as multi-layer ceramic capacitors (MLCC), uses a test system to determine the quality of a lot of product before the product is sold to a customer. The test system performs several tests that provide data on the capacitance, dissipation factor and insulation resistance (IR). The data can then be used to sort the parts by tolerance and find those parts that are defective. For example, for a given capacitance value, a capacitor has a minimum value for resistance below which a capacitor is unacceptable.

Tests are performed in sequence depending on individual manufacturer requirements. For example, a part can first undergo a capacitance and dissipation factor measurement at one station using a capacitance meter. After this, a leakage test can be performed.

Turning now to FIG. 1, a theoretical plot of voltage across a capacitor being tested versus time is illustrated, where at $t_0$ the part is at zero volts. At $t_1$, the part begins charging to a programmed voltage value. In this example, the part is changed with a constant-current source. At $t_2$, the part has reached the programmed value. At $t_3$, all measurements are complete and the part can begin discharging. At $t_4$, the part is discharged to zero volts. FIG. 2 is a theoretical plot of the current through the capacitor being tested versus time. At $t_0$ the part is at zero volts, and therefore has no current flowing through the part. At $t_1$, the part begins charging. At $t_2$, the part is charged so it no longer accepts current. This graph assumes an ideal capacitor and neglects parasitics, such as leakage current and dielectric absorption. At $t_3$, the part begins discharging by reversal of the current from the constant-current source. Current flows in the reverse direction until the part reaches zero volts at $t_4$.

A leakage test, also called an insulation resistance (IR) test, occurs at the end of a period of time at which the part is held at the programmed voltage. This so-called "soak time" extends from $t_2$ to $t_3$. Just before discharge at time t3, a measurement to obtain leakage current is taken. The current through the capacitor when a voltage is applied is the leakage current, and the insulation resistance is equal to the voltage divided by the leakage current. The leakage current can be compared to a maximum current based on the type of capacitor being measured and the tolerance of the manufacturer such that a capacitor passing a current above the maximum value would fail. In the example of FIGS. 1 and 2, the leakage current would be zero.

SUMMARY

One embodiment of the invention taught herein is a method for testing a capacitor. The method comprises performing a test cycle on a plurality of first capacitors over a test period, the test cycle including: charging each first capacitor to a target voltage value from a starting voltage during a charging period, the charging period ending when the target voltage value is reached; holding each first capacitor at the target voltage value for a soak time period after an end of the charging period; and discharging each first capacitor by discharging a stored charge and reducing a voltage below the target voltage value over a discharge period starting after an end of the soak time period. The method also includes periodically measuring a current through each first capacitor during at least the soak time period, each first capacitor producing a first plurality of current values, training a predictive function using the first plurality of current values from each of the plurality of first capacitors, charging a second capacitor to the target voltage value from a starting voltage during a charging period, the charging period ending when the target voltage value is reached, holding the second capacitor at the target voltage value for a prediction time period after an end of the charging period, the prediction time period being shorter than the soak time period, measuring a current through the second capacitor more than once during the prediction time period to obtain a second plurality of current values, applying the second plurality of current values to the predictive function to predict whether the current through the second capacitor at the end of the soak time period would be higher than a predetermined value and discharging the second capacitor by discharging a stored charge and reducing a voltage below the target voltage value over a period of time equal to the discharge period starting after an end of the prediction time period.

Details of this embodiment and others will become apparent to those skilled in the art when the following description is read in conjunction with the accompanying drawings.

BRIEF DESCRIPTION OF THE DRAWINGS

The description herein makes reference to the accompanying drawings wherein like reference numerals refer to like parts throughout the several views, and wherein.

DETAILED DESCRIPTION

As described above, with an ideal capacitor, no leakage current is detected at the end of the soak time. However, an actual capacitor has leakage current. A capacitor with excessive leakage current may not perform in a circuit as intended by the design and increases power losses over one with a lower leakage current. Leakage testing may also help identify a manufacturing process that is out of control tolerances because the number of failed capacitors is relatively low and generally less than 2% in mature processes. If the number of failed capacitors is higher, the manufacturing process may be the problem.

Figure 1:
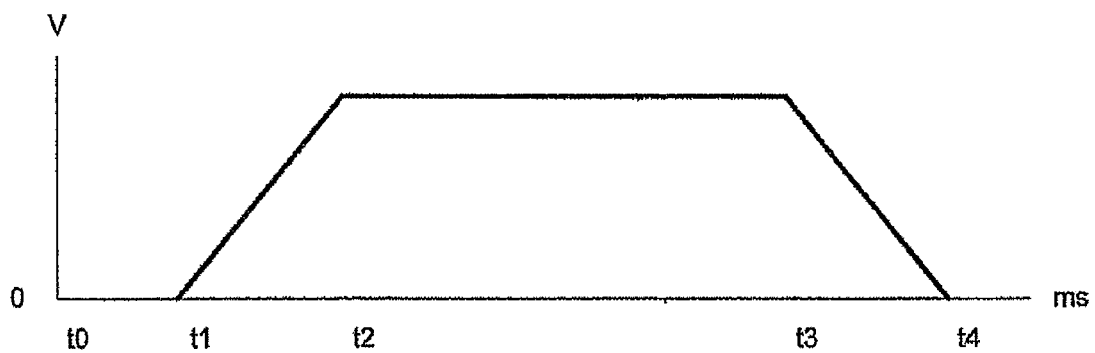
FIG. 1 is a theoretical plot of voltage across a capacitor being tested versus time.
Figure 2:
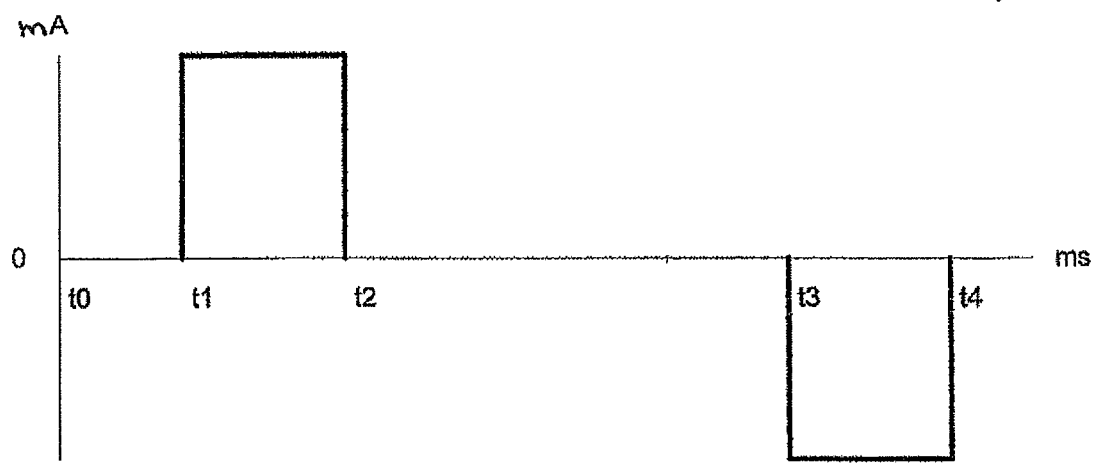
FIG. 2 is a theoretical plot of current through the capacitor being tested versus time.
Figure 3:
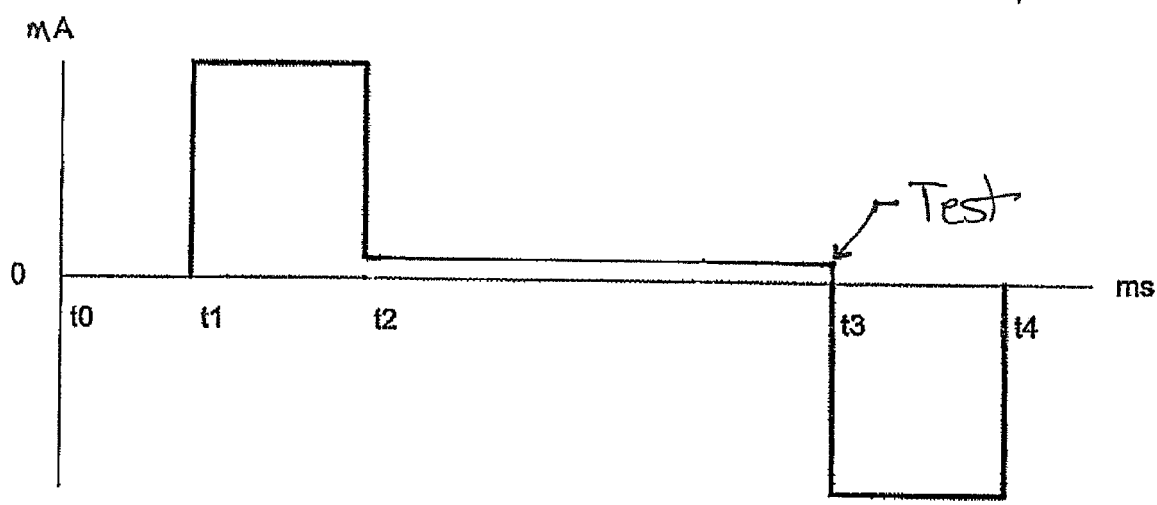
FIG. 3 is a theoretical plot of current through a capacitor being tested versus time where the capacitor has no dielectric absorption but has excessive leakage.

In contrast with the ideal capacitor, when the constant-current source described previously is connected to a capacitor with no dielectric absorption but with excessive leakage, the capacitor acts as if it is in parallel with a resistance. A current plot for this capacitor is shown in FIG. 3.

Of course, no capacitor is completely without dielectric absorption, although many use dielectrics with low dielectric absorption. Thus, even a capacitor with acceptable leakage would display leakage current at the end of soak time due to the presence of dielectric absorption. Dielectric absorption makes the capacitor act as if it is in parallel with a series connected resistor and capacitor.

The method of measuring the insulation resistance of a capacitor described previously is commonly known as a univariant predictive insulation resistance (IR) method. This method of measuring the insulation resistance $R_{ins}$ involves charging the capacitor up to a test voltage $V_{test}$ at a controlled maximum current $I_{max}$. Once the capacitor reaches the test voltage, the current $I_{soak}$ required to maintain that voltage is a combination of the transient and steady state current. The steady state current, or leakage current $I_{leakage}$, is due to the insulation resistance where $I_{leakage} = V_{test}/R_{ins}$. The capacitor's transient, nonlinear and random behavior requires the capacitor to be soaked at $V_{test}$ for a period of time $T_{soak}$ in order to correctly determine the steady state current $I_{leakage}$. As the transient current dies down, the steady state leakage current can be discerned from the soaking current $I_{soak}$.

If the steady state leakage current is less than a customer defined $I_{thresh}$, then the device under test (DUT) passes the IR test. The threshold current can be calculated by $I_{thresh} = V_{test}/R_{min}$ where $R_{min}$ is a minimum acceptable resistance. Many factors affect the rate at which the leakage current reaches a steady state and its level. These include, for example, dielectric class/type, capacitance value, process quality, dielectric layer thickness, test voltage $V_{test}$, surface conditions, a previous test and temperature, especially humidity. Certain of these factors can also affect the variability at which the transient current decays.

Figure 4:
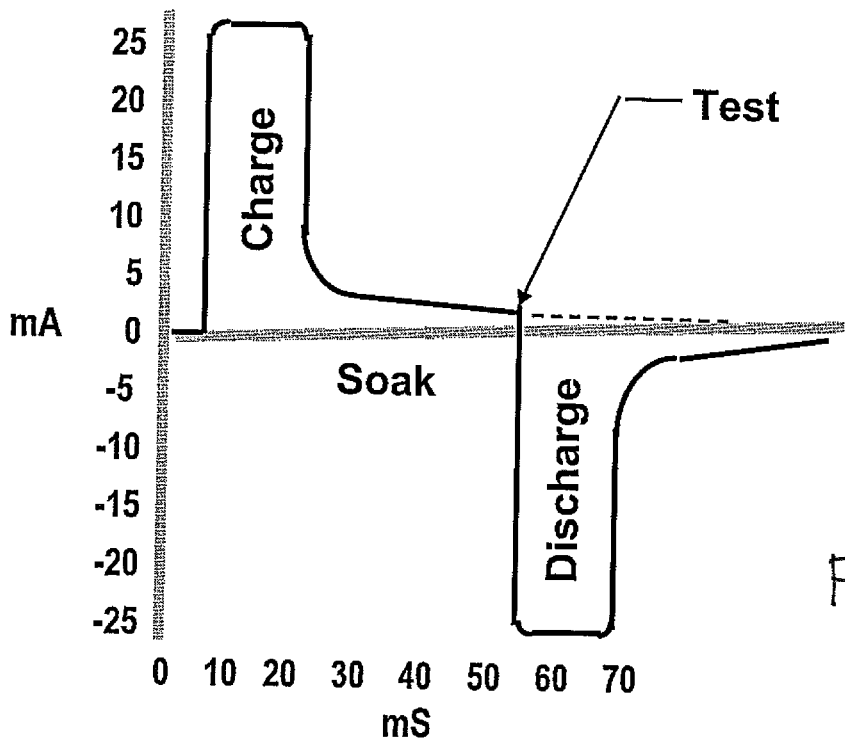
FIG. 4 is a plot of current through a capacitor being tested versus time where the capacitor has dielectric absorption and acceptable leakage current.
Figure 5:
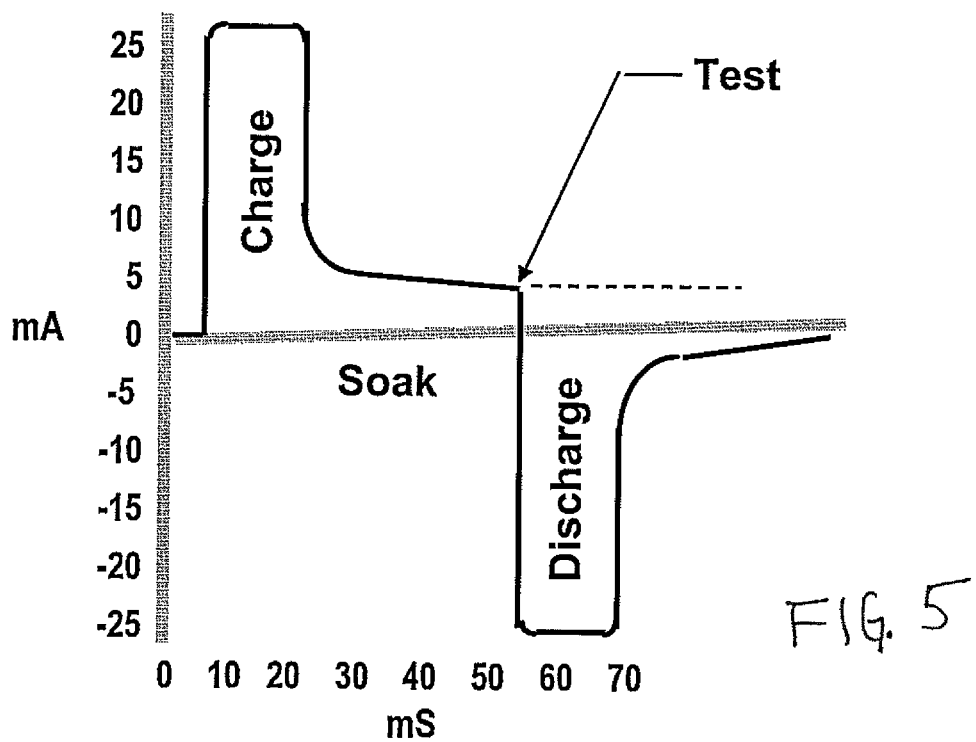
FIG. 5 is a plot of current through a capacitor being tested versus time where the capacitor has dielectric absorption and excessive leakage current.

As capacitors become smaller and higher in capacitance, the effects of the dielectric and parasitic elements become more pronounced and more complex. Ideally, the electrical properties of a capacitor would be observed for a long period of time to minimize these effects. This would allow charge stabilization where only a small proportion of measured current is charge current. This can be illustrated by a comparison of FIG. 4 with FIG. 5. FIG. 4 is a plot of current through a capacitor being tested versus time where the capacitor has dielectric absorption and acceptable leakage. At the end of the soak time, leakage is detected due to the dielectric absorption. Given a long soak time, the current would fall to an acceptable level as indicated by the dotted line. In contrast, FIG. 5 is a plot of current through a capacitor being tested versus time where the capacitor has dielectric absorption and excessive leakage. At the end of the soak time, leakage is detected due to dielectric absorption and the equivalent parallel resistance. Since there is no way to predict an acceptable time before a capacitor with dielectric absorption is fully charged, and since the contribution of dielectric absorption over time to leakage decays non-linearly at variable rates, a long soak period $T_{soak}$ is desirable.

However, a long soak time or period $T_{soak}$ is not feasible from a manufacturing standpoint because it would take too long to test millions of devices. Parallel testing can be used on high value capacitors that can afford a higher cost of test. In this approach, a number of capacitors (such as 500 or so) are concurrently charged and then leakage current is scanned after they have been soaked for one or more minutes. Generally, however, the industry relies on serial testing that uses a single measurement for each capacitor after the start of the soak time $T_{soak}$ to make a determination of the status of the parts.

The industry standard for measuring the leakage current through a capacitor is to use an Agilent 4349B High Resistance Meter in combination with a programmable voltage and current source. The Agilent 4349B is a high precision instrument that uses an integrating current-to-voltage converter and a selectable integration time of 10, 30, 100 and 400 milliseconds. Using a longer integration time provides a higher signal-to-noise ratio, which is useful when measuring extremely small currents. The output of the meter is a single current reading after this integration period is complete. Therefore, the user relies on one measurement to decide whether a given capacitor is acceptable or not. The user can repeat this test at another station for more data, though doing so increases machine cost and complexity. The user typically wants the measurement to be as accurate as possible, and would like to use the longest integration time possible to maximize the signal-to-noise ratio. However, the user has to consider how much time the user can afford to make this measurement versus the accuracy of the measurement. The voltage and current supply can be any programmable computer-controlled device, such as the 54XX Series power supply from Electro Scientific Industries, Inc. of Portland, Oreg. This device is synchronized with the Agilent measurement device, as the timing between startup charge and the start of measurement must be very well controlled.

Figure 6:
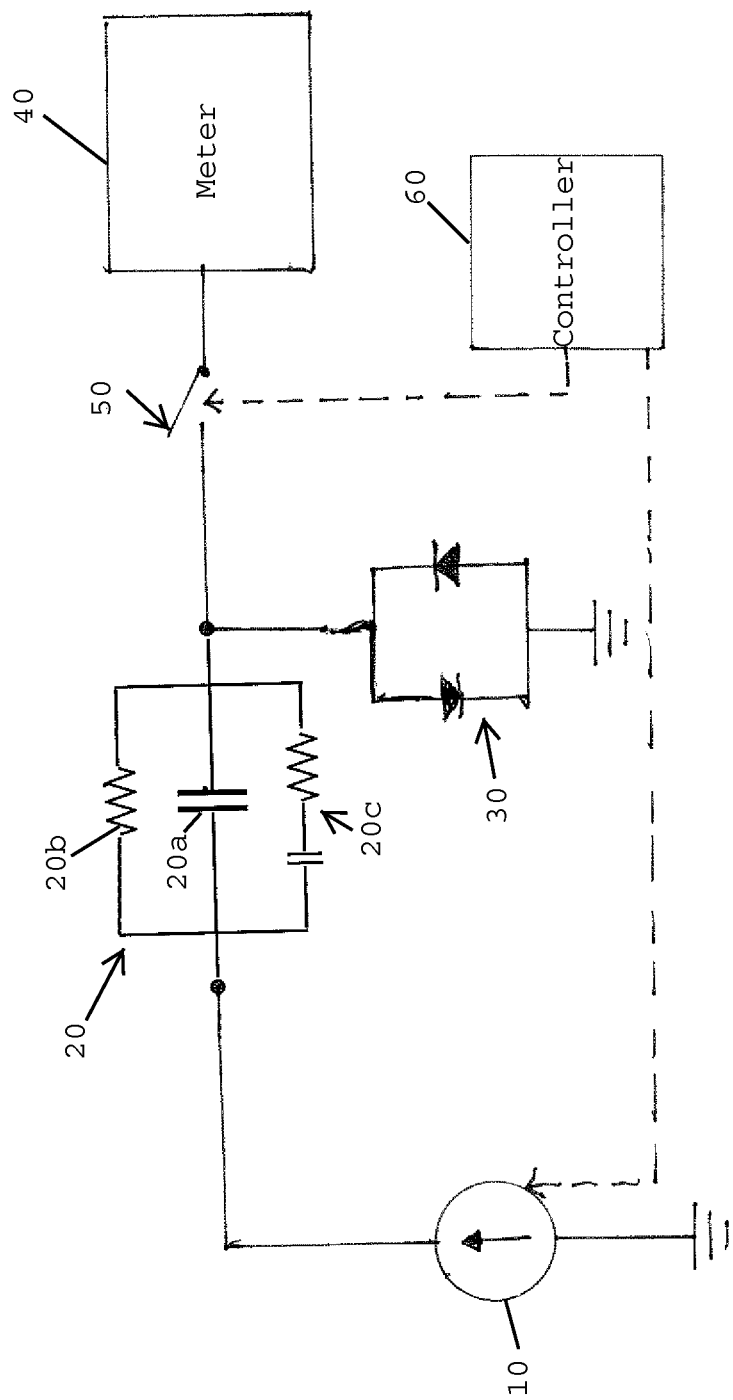
FIG. 6 is a simplified schematic diagram of a test apparatus for testing the leakage current of a capacitor.

A simplified schematic of this arrangement is shown in FIG. 6. Constant current source 10 supplies current to device under test (DUT) 20. Note that DUT 20 is shown as an equivalent circuit whereby 20a is the capacitance, 20b is the RC circuit representing dielectric absorption, and 20c is a resistance Rp representing the dielectric resistance giving rise to the steady state leakage current. DUT 20 is coupled between source 10 and meter 40. More specifically, meter 40 is coupled to the low side of DUT 20 through switch 50. Between switch 50 and DUT 20 is a diode clamp 30 comprising back-to-back diodes coupled to ground. As mentioned, synchronization between meter 40 and source 10 must be very well controlled in order to reduce inaccuracies, so a controller 60 is used for such synchronization. Controller 60 as shown is a device that includes random access memory (RAM), read only memory (ROM) and a central processing unit (CPU). More specifically, controller 60 is generally a microcomputer including CPU, input and output ports (I/O), RAM, keep alive memory (KAM), a common data bus and ROM as an electronic storage medium for executable programs and certain stored values. The functions of the controller 60 described herein could be, for example, implemented in software as the executable programs, or could be implemented in whole or in part by separate hardware in the form of one or more integrated circuits (IC). As described in more detail herein, controller 60 is configured to perform operations to extract data and use that data to characterize DUT 20.

In place of the circuit shown in FIG. 6, an arrangement such as shown in US 2008/0290879 A1, entitled Capacitive Measurements with Fast Recovery Current Return, and US 2009/0243636 A1, entitled Programmable Gain Trans-Impedance Amplifier Overload Recovery Circuit, each of which is assigned to Electro Scientific Industries, Inc. and each of which is incorporated herein in its entirety by reference, can be used. Note that although only a constant current source is shown in FIG. 5, the source charging the capacitor could include both a programmable voltage source and a programmable current source. For example, a voltage source can be set to a desired test voltage for the DUT 30. A series connected current source could output a programmed current using the voltage source as described in US 2008/0290879 A1, for example.

In serial testing using an arrangement such as that shown in FIG. 6, a predictive IR measurement method can be used that takes a single sample at $T_{predictUni}$, which is less than $T_{soak}$. The single sample is used to predict if the actual leakage current at $T_{soak}$ will be less than $I_{threshold}$. The IR leakage of a device is predicted to be less than $I_{threshold}$ at $T_{soak}$ if the measured leakage at $T_{predictUni}$ is less than a predetermined $I_{thresholdPredict}$. An IR characterization method is used to determine $I_{thresholdPredict}$. The characterization takes periodic current samples while soaking the DUT until $T_{soak}$ is reached. Process development analysis uses the characterization measurements to pick a time $T_{predictUni}$ and a current $I_{thresholdPredict}$ that can be used to predict the pass/fail of a DUT with a certainty $C_{predict}$. For example, a certainty $C_{predict}$ of 95% may be an acceptable compromise between speed and reliability of the tests.

In contrast, a multivariate predictive IR test uses multiple periodic samples of leakage current while soaking the DUT 20 for a short period of time for use in a predictive function to predict a pass/fail result. IR characterization data is used to train the predictive function.

The benefits of such a test include a decrease in the cost of testing resulting from increasing system throughput. Throughput is proportional to DUT testing time, and the majority of this testing time is spent soaking the DUT 20. The multivariate predictive IR test has a shorter soaking time $T_{predictMulti}$ for the same certainty $C_{predict}$ achieved by the univariant predictive IR soak time of $T_{predictUni}$. In addition, the results of such a test exhibit lower false positive and false negative failures. Another benefit is the possibility of automated process development whereby it is possible to automate the test process development to tune the process parameters of test voltage, current and soaking time.

More specifically, the variability of leakage current decreases during the soaking time. Univariant predictive IR must wait until $T_{predictUni}$ for the leakage measurement variability to have enough statistical significance to predict the pass/fail of a DUT with a certainty $C_{predict}$. Conventionally, meter 40 is idle while DUT 20 is soaking. Accordingly, there is no more overhead on the system to take multiple measurements while soaking. IR and other measurements can be taken at 10 kHz sample rates or greater.

For these reasons, multivariate predictive IR takes multiple periodic samples while soaking DUT 20. Multiple samples enable a shorter $T_{predictMulti}$ period than that of $T_{predictUni}$ to achieve the same certainty $C_{predict}$. It is worth noting that individual samples of leakage current taken before $T_{predictUni}$ have a lower statistical significance than the sample at $T_{predictUni}$. For this reason, the lower statistical significance sample can be stochastically combined with a predictive function to predict the binary pass/fail result.

The predictive function is a classifier that takes periodic sampled leakage data of DUT 20 and produces a binary pass/fail result. A non-limiting list of options for a binary classification predictive function include:
Multi-variable tree classification;
Two-variable classification;
Generalized linear model classification;
Neural network model classification; and
Exponential function fitting with weighted samples.

The training of the predictive function is performed by statically processing the IR characterization data taken from soaking and measuring M devices of the same type under the same $I_{max}$ and $V_{test}$ parameters. N periodic samples are taken during the soaking period $T_{soak}$. The samples are digitized and supplied to controller 60 for analysis.

While there are several methods that the controller 60 can use for the predictive function, by example an experiment using an exponential function fitting was performed. A sample population of 75 MLCC devices, each having a rating of 3 nF, was soaked at 20 volts for 500 ms. The leakage current was measured approximately every 4 ms.

Figure 7:
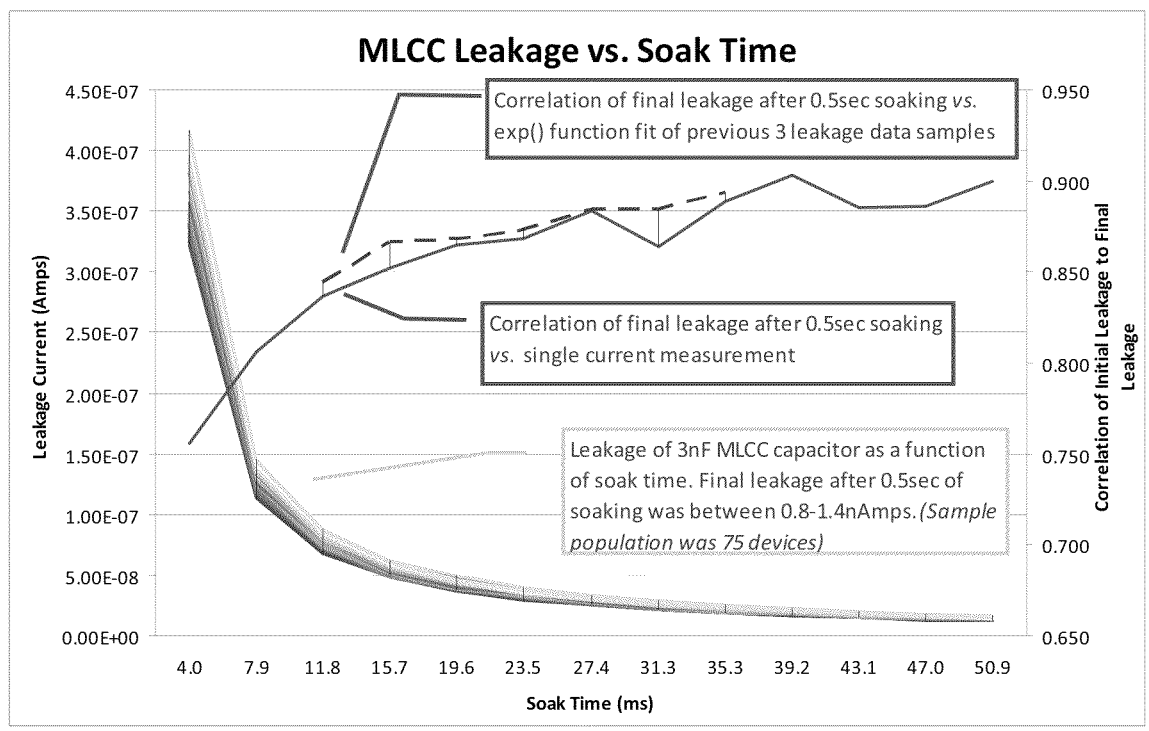
FIG. 7 is a graph illustrating MLCC leakage current versus soak time comparing a univariant to a multivariant method.

The initial leakage values were in the range of 300 to 400 nAmps, while the final leakage values after 500 ms of soaking were in the range of 0.8-1.4 nAmps. To judge how well the initial leakage measurements can predict the final leakage current, a correlation function was used to measure the relationship between initial measurements early in the soaking stage versus the final leakage value. The graph of FIG. 7 shows how a measurement 4 ms into the soak period has a 0.755 correlation to predicting the final leakage value. After 39.2 ms, this correlation peaks at 0.903.

Instead of using a single sample the correlation can be improved by using the previous 3 samples before the present time period to create an exponential function that helps average out the measurement/device noise and to create a better predictor of final leakage current. Using a function fit to calculate the current leakage, the correlation can be improved by approximately 1%. The improvement in correlation demonstrates that the current measurement using the multiple samples is a better predictor of whether the final leakage current value will be above or below a predetermined value used to pass or fail the capacitor.

As described above, the industry relies on data collected during a short period of time to determine whether a part is satisfactory or defective. The present invention seeks to maximize the information that can be gathered during this time to make a more educated and accurate determination. Rather than taking one current reading at a certain point in time after the capacitor is charged, these measurements can be taken multiple times, periodically, during charging, holding and discharging a plurality of parts.

Such data collection also allows the complete digitization of current and, if desirable, voltage curves. Namely, as described above, a number of capacitors of a similar type to that of the capacitors of concern can be tested, and the collective data can be used to develop digitized curves against which test data from a subsequent capacitor can be compared to predict whether it varies from the norm. For example, each point of the curve could be an average of values from a number of capacitors. To increase the accuracy of the digitized wave forms, i.e. voltage versus time or current versus time, digital filtering can be used to remove unwanted frequencies that could interfere with the data. Multiple insulation resistance data points can be analyzed instead of a single insulation resistance data reading that the Agilent 4349B meter provides. Because the industry uses a "predictive" approach to testing capacitors in order to save time and increase throughput, as opposed to waiting for an extended soak time to pass so that only the steady state leakage current is left, making a determination by analyzing a line results in a more accurate determination of the status of a test capacitor.

The test data can be used to form a predictive function that can predict the pass/fail of any number of subsequently-tested capacitors having similar characteristics, including size, rating, dielectric material, etc. The data can be used by engineers to better understand the capacitors, the test process and failure modes. The data can also be used to optimize the test, which could then lead to an increase in throughput and even a reduction in machine cost if tests can be shortened or perhaps skipped entirely.

The invention allows the acquisition of capacitor voltage in addition to acquiring the entire current curve, including charge and discharge currents. These parameters are currently not used in the industry, because the capability is not provided on the equipment used. Therefore, it is not known exactly what information can be extracted from the voltage and current curves. However, being able to acquire the data and process it will be very useful as a research tool to help identify the information present in the curves. Combining these parameters with the leakage current measurement will provide the user with more information for validating the capacitors being tested, the process, and also help to determine the failure modes.

While the invention has been described in connection with certain embodiments, it is to be understood that the invention is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A method for testing a capacitor, comprising:
    performing a test cycle on a plurality of first capacitors over a test period, the test cycle including:
        charging each first capacitor to a target voltage value from a starting voltage during a charging period, the charging period ending when the target voltage value is reached;
        holding each first capacitor at the target voltage value for a soak time period after an end of the charging period; and
        discharging each first capacitor by discharging a stored charge and reducing a voltage below the target voltage value over a discharge period starting after an end of the soak time period;
    periodically measuring a current through each first capacitor during at least the soak time period, each first capacitor producing a first plurality of current values;
    training a predictive function using the first plurality of current values from each of the plurality of first capacitors;
    charging a second capacitor to the target voltage value from a starting voltage during a charging period, the charging period ending when the target voltage value is reached;
    holding the second capacitor at the target voltage value for a prediction time period after an end of the charging period, the prediction time period being shorter than the soak time period;
    measuring a current through the second capacitor more than once during the prediction time period to obtain a second plurality of current values;
    applying the second plurality of current values to the predictive function to predict whether the current through the second capacitor at the end of the soak time period would be higher than a predetermined value; and
    discharging the second capacitor by discharging a stored charge and reducing a voltage below the target voltage value over a period of time equal to the discharge period starting after an end of the prediction time period.

2. The method according to claim 1, further comprising: digitizing a curve of the current over time using the first plurality of current values.

3. The method according to claim 2, further comprising: obtaining each data point of the curve by averaging those of the first plurality of current values associated with a respective time at which the current was measured.

4. The method according to claim 1, further comprising: periodically measuring a voltage value of each first capacitor during at least two of the charging period, the soak time period and the discharge period to obtain a plurality of voltage values during each of the at least two periods.

5. The method according to claim 4, further comprising: digitizing a voltage curve versus time from the plurality of voltage values.

6. The method according to claim 1 wherein periodically measuring the current through each first capacitor during at least the soak time period further comprises:
    periodically measuring the current through each first capacitor during the charging period.

7. The method according to claim 1, further comprising: digitally filtering each of the first plurality of current values to remove unwanted frequencies that could interfere with collected data.

8. The method according to claim 1 wherein charging each first capacitor comprises charging each first capacitor with a constant current source to the target voltage value.

9. The method according to claim 8 wherein the constant current source is synchronized with a measurement device for periodically measuring the current though each first capacitor and measuring the current through the second capacitor.

10. The method according to claim 1 wherein measuring the current through the second capacitor more than once comprises measuring the current through the second capacitor at least three times.

11. The method according to claim 10 wherein applying the second plurality of current values to the predictive function comprises fitting the second plurality of current values to an exponential function.

12. The method according to claim 1 wherein the predictive function comprises exponential function fitting with weighted samples.

13. The method according to claim 1 wherein the predictive function comprises one of multi-variable tree classification, two-variable classification, generalized linear model classification or neural network model classification.

* * * * *